(12) United States Patent
Van Gaal et al.

(10) Patent No.: US 10,188,011 B2
(45) Date of Patent: Jan. 22, 2019

(54) OFFLOADED BACKPLANE FOR POWER DISTRIBUTION IN HIGH-SPEED DATA APPLICATIONS

(71) Applicant: Ciena Corporation, Hanover, MD (US)

(72) Inventors: Adrianus P. Van Gaal, Ottawa (CA); Robert L. Bisson, Kanata (CA); Andrew Douglas Thuswaldner, Ottawa (CA); Timothy David Mombourquette, Nepean (CA)

(73) Assignee: Ciena Corporation, Hanover, MD (US)

( * ) Notice: Subject to any disclaimer, the term of this patent is extended or adjusted under 35 U.S.C. 154(b) by 169 days.

(21) Appl. No.: 14/956,619

(22) Filed: Dec. 2, 2015

(65) Prior Publication Data

US 2017/0164500 A1 Jun. 8, 2017

(51) Int. Cl.
*H05K 1/14* (2006.01)
*H05K 7/14* (2006.01)
*H04Q 1/02* (2006.01)

(52) U.S. Cl.
CPC ............. *H05K 7/1457* (2013.01); *H04Q 1/03* (2013.01); *H04Q 1/15* (2013.01); *H05K 7/1444* (2013.01)

(58) Field of Classification Search
CPC .................................................. H05K 7/1457
See application file for complete search history.

(56) References Cited

U.S. PATENT DOCUMENTS

| | | | |
|---|---|---|---|
| 4,703,394 A * | 10/1987 | Petit | H05K 7/1445 361/790 |
| 5,450,272 A | 9/1995 | Van Gaal et al. | |
| 6,201,708 B1 | 3/2001 | Lewis et al. | |
| 6,392,160 B1 | 5/2002 | Andry et al. | |
| 6,511,330 B1 * | 1/2003 | Norris | H05K 7/1452 439/76.1 |
| 6,757,177 B2 | 6/2004 | Harris et al. | |
| 6,822,876 B2 | 11/2004 | Goergen | |
| 6,884,091 B1 * | 4/2005 | Rigby | H01R 12/7088 439/737 |
| 7,448,132 B2 | 11/2008 | Goergen | |
| 7,518,883 B1 | 4/2009 | Suitor et al. | |
| 7,695,314 B2 * | 4/2010 | Okuyama | H05K 1/141 439/541.5 |
| 2008/0239687 A1 * | 10/2008 | Leigh | H05K 1/144 361/788 |

(Continued)

OTHER PUBLICATIONS

"Universal Military Craft Systems Controller PCI Systems Inc.", http://www.pcisystems.com/openvpxpresyscpu/, site accessed Nov. 17, 2015.

*Primary Examiner* — Yuriy Semenenko
(74) *Attorney, Agent, or Firm* — Clements Bernard Walker PLLC; Christopher L. Bernard; Lawrence A. Baratta, Jr.

(57) ABSTRACT

A backplane system for a high-speed network element includes a main backplane including a plurality of traces for data and control connectivity, high-speed data connectors, and a power connector, wherein the high-speed data connectors and the power connector are configured to engage one or more modules; and a power backplane for power connectivity separate from the main backplane connected to the power connector, wherein the power backplane is coupled to a power source to provide supply and return current to the one or more modules through the power connector.

15 Claims, 9 Drawing Sheets

(56) References Cited

U.S. PATENT DOCUMENTS

| | | | | |
|---|---|---|---|---|
| 2012/0269484 A1* | 10/2012 | Peto | ................ | H01R 24/60 385/76 |
| 2014/0268611 A1* | 9/2014 | Naufel | ................ | H05K 7/1457 361/767 |
| 2015/0092788 A1* | 4/2015 | Kennedy | ................ | G06F 1/185 370/419 |

* cited by examiner

OFFLOADED BACKPLANE FOR POWER DISTRIBUTION IN HIGH-SPEED DATA APPLICATIONS

FIELD OF THE DISCLOSURE

The present disclosure generally relates to networking and computing hardware systems and methods. More particularly, the present disclosure relates to an offloaded backplane for power distribution in high-speed data applications.

BACKGROUND OF THE DISCLOSURE

A backplane physically includes a set of electrical connectors to interconnect data, control, and power between a set of modules, line cards, blades, etc. (collectively referred to as "modules"). In networking and computing applications, devices such as network elements, switches, routers, servers, storage devices, etc. (collectively referred to as "network elements") can utilize a modular physical implementation where functionality is implemented on various modules which plug into the backplane. Of note, network elements continue to grow in terms of the amount of data supported in single configurations. Conventionally, a typical network element physically supports hundreds of Gb/s of data connectivity. However, network elements are evolving to support physically tens to hundreds and beyond of Tb/s of data connectivity in a single rack or frame or even in a single shelf or chassis. In conventional implementations, backplanes are used to interconnect all data, control, and power to all pluggable modules. For power, there are typically two feeds, A and B, to each module. The power feeds are typically copper distribution layers on the backplane. With the two power feeds, A and B, distributing both supply and return currents, four or more heavy copper layers are required on the backplane.

These additional copper layers, significant impact the cost of the backplane, especially as more expensive backplane technologies are required for high-speed data systems (i.e., tens to hundreds and beyond of Tb/s of data connectivity). These high-speed systems also have higher power dissipation, which require thicker copper in the power layers. Also, the space required for the two power feeds, A and B, also end up increasing the required size of the backplane, significantly impacting the cost and size of the backplane.

BRIEF SUMMARY OF THE DISCLOSURE

In an exemplary embodiment, a backplane system for a high-speed network element includes a main backplane including a plurality of traces for data and control connectivity, high-speed data connectors, and power connectors, wherein the high-speed data connectors and the power connectors are configured to engage one or more modules; and a power backplane for power connectivity separate from the main backplane and connected to the power connectors, wherein the power backplane is coupled to a power source to provide supply and return current to the one or more modules through the power connectors. The main backplane has no power layers and no power connectivity routed thereon. The power backplane can be connected to the power connectors on the main backplane by through hole vias. The backplane system can further include a rear power plug located on an opposite side of the main backplane as the power connectors, wherein the rear power plug is connected to the power connectors; and a power plug on the power backplane connected to the rear power plug. The power connectors, the rear power plug, and the power plug can be in a back-to-back configuration where each is substantially in a same horizontal plane. The power connectors can be in close proximity to the rear power plug such that the main backplane has minimal routing of power from the rear power plug to the power connectors. The power connectors can provide supply and return currents for two power feeds from the power backplane.

In another exemplary embodiment, a high-speed network element includes a chassis supporting one or more modules; a main backplane in the chassis, wherein the main backplane includes a plurality of traces for data and control connectivity, high-speed data connectors, and power connectors, wherein the high-speed data connectors and the power connectors are configured to engage the one or more modules; and a power backplane for power connectivity separate from the main backplane and connected to the power connectors, wherein the power backplane is coupled to a power source to provide supply and return current to the one or more modules through the power connectors. The main backplane has no power layers and no power connectivity routed thereon. The power backplane can be connected to the power connectors on the main backplane by through hole vias. The high-speed network element can further include a rear power plug located on an opposite side of the main backplane as the power connectors, wherein the rear power plug is connected to the power connectors; and a power plug on the power backplane connected to the rear power plug. The power connectors, the rear power plug, and the power plug can be in a back-to-back configuration where each is substantially in a same horizontal plane. The power connectors can be in close proximity to the rear power plug such that the main backplane has minimal routing of power from the rear power plug to the power connectors. The power connectors can provide supply and return currents for two power feeds from the power backplane. The one or more modules can support data connectivity through the high-speed network element of at least one Tb/s.

In a further exemplary embodiment, an operating method of a high-speed network element includes providing data and control connectivity to one or more modules through a plurality of traces on a main backplane, wherein the one or more modules are engaged to high-speed data connectors and power connectors on the main backplane; and providing power connectivity to the one or more modules through a power backplane separate from the main backplane and connected to the power connectors, wherein the power backplane is coupled to a power source to provide supply and return current to the one or more modules through the power connectors. The main backplane has no power layers and no power connectivity routed thereon. The power backplane can be connected to the power connectors on the main backplane by through hole vias. A rear power plug can be located on an opposite side of the main backplane as the power connectors, wherein the rear power plug is connected to the power connectors; wherein a power plug is located on the power backplane connected to the rear power plug; and wherein the power connectors, the rear power plug, and the power plug are in a back-to-back configuration where each is substantially in a same horizontal plane. A rear power plug can be located on an opposite side of the main backplane as the power connectors, wherein the rear power plug is connected to the power connectors; wherein a power plug is located on the power backplane connected to the rear power plug; and wherein the power connectors are in close proximity to the rear power plug such that the main backplane has minimal routing of power from the rear power plug to the power connectors.

BRIEF DESCRIPTION OF THE DRAWINGS

The present disclosure is illustrated and described herein with reference to the various drawings, in which like reference numbers are used to denote like system components/ method steps, as appropriate, and in which.

DETAILED DESCRIPTION OF THE DISCLOSURE

In various exemplary embodiments, an offloaded backplane for power distribution in high-speed data applications is described. The offloaded backplane utilizes a daughter board to distribute power and deliver power into a backplane at the location required to avoid the need for additional layers for power distribution on the main backplane. That is, the offloaded backplane only provides control and data connectivity and power connectivity is performed through a daughter board. By avoiding power distribution on the main backplane, i.e., the offloaded backplane, the space and cost of the main backplane are reduced. In an exemplary embodiment, the daughter board connects to modules through vias in the offloaded backplane. In another exemplary embodiment, alternate connectors could be used in close proximity to the backplane power connector. This would require routing of the power, but additional backplane layers can still be avoided if the alternate connectors are closely coupled, and the power tracks can use layers already required by control and data tracks.

Advantageously, the offloaded backplane can i) use the daughter card for power distribution, to eliminate power layers on the offloaded backplane; ii) use back-to-back power connectors to eliminate the space required for the input power connection; iii) use the power distribution daughter card to allow the use of mixed technology (solder and compliant) on an inexpensive distribution Printed Circuit Board (PCB); etc. The offloaded backplane, by keeping power distribution on a separate daughter card, limits the layer count, thickness, and size, and, by using back to back connectors, no additional power layers are required, and no additional space is required for input connection. Alternatively, the connector could be adjacent to the module connector, to avoid the need for additional layers, and minimal additional board area being required. When the power connectors are adjacent to each other, layers used for signal routing in other areas of the backplane can be used for power in the area of the power connectors.

Figure 1:
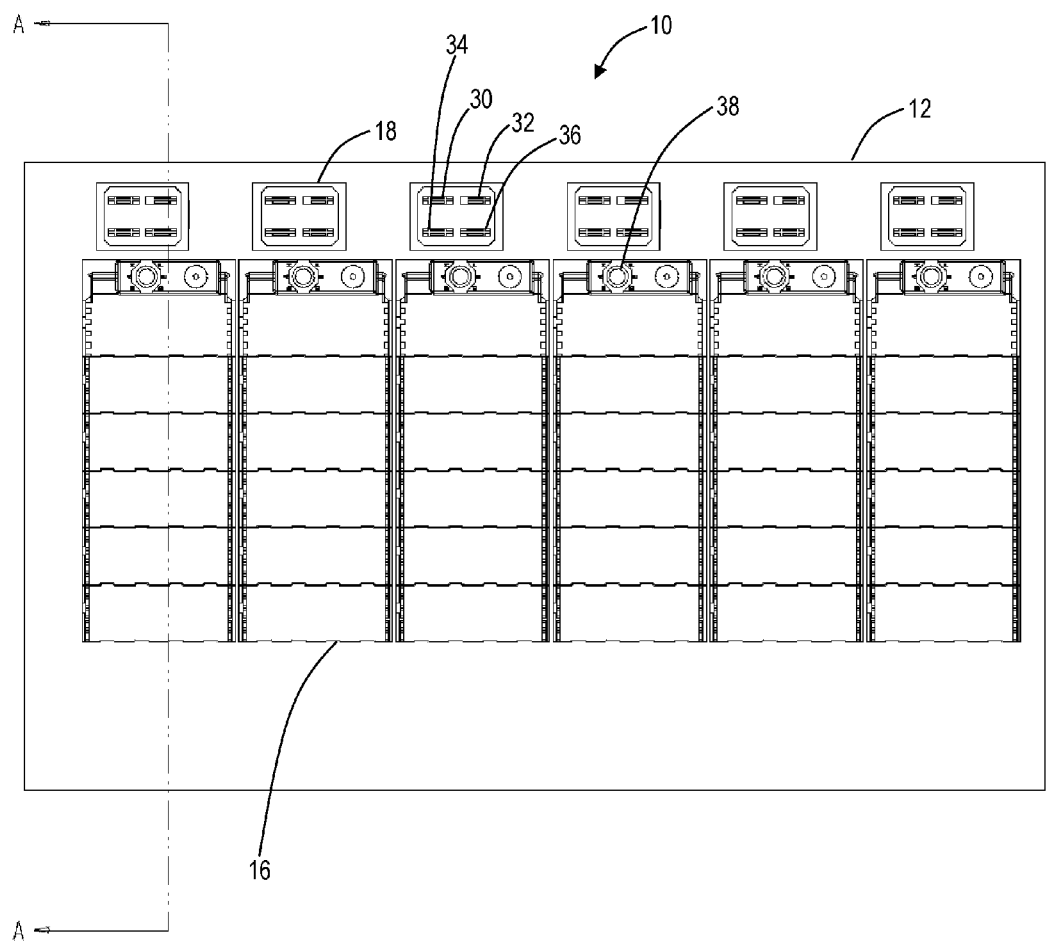
FIG. 1 is a front perspective diagram of the main backplane where modules (not shown) are selectively plugged into high-speed connectors and a power connector.
Figure 2:
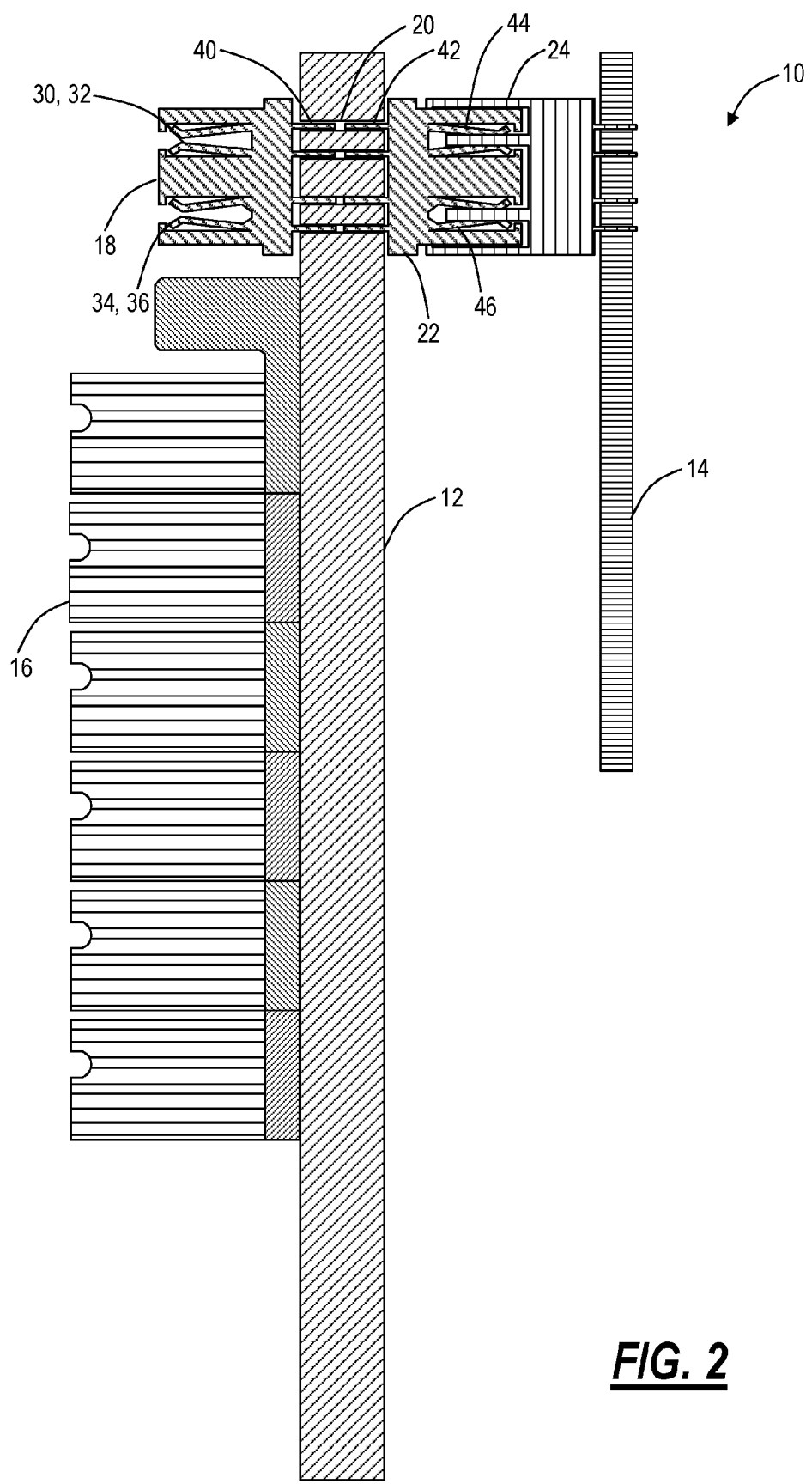
FIG. 2 is a cross-sectional diagram of a cross-section from FIG. 1 illustrating an interconnection between the main backplane and the power backplane.
Figure 3:
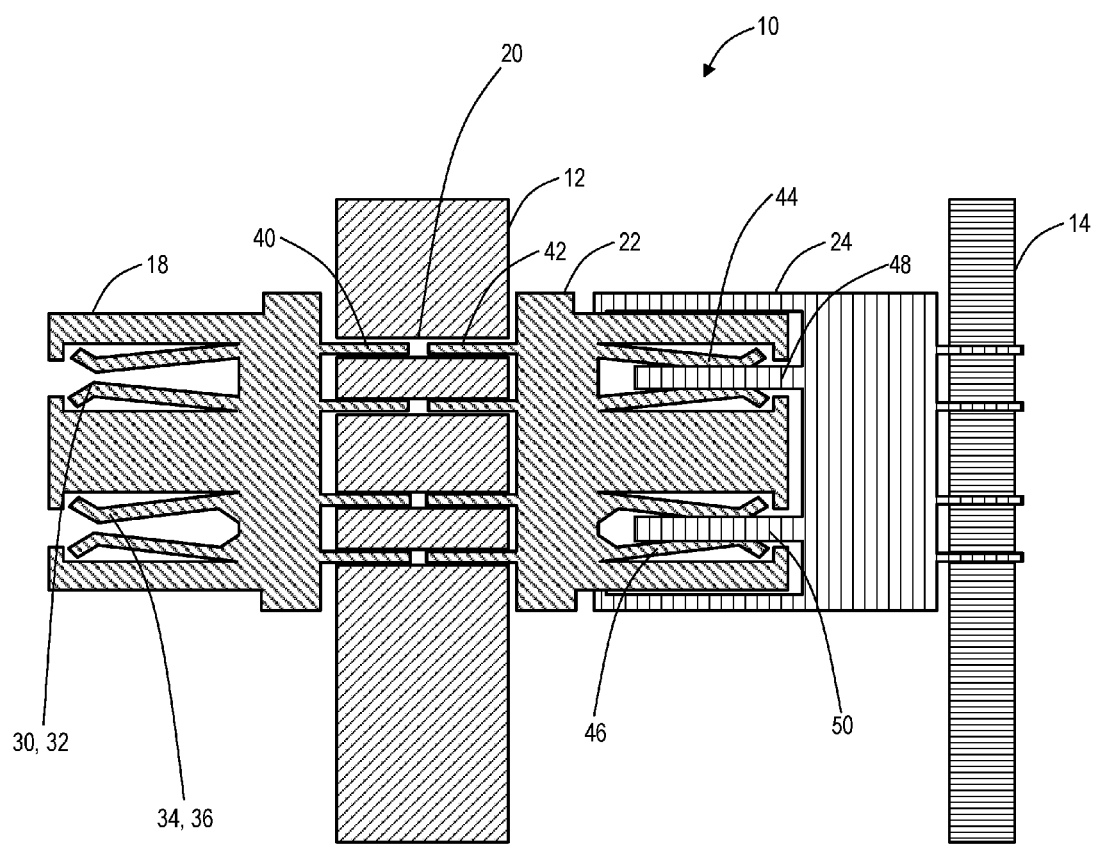
FIG. 3 is a cross-sectional diagram of additional detail from FIG. 2 illustrating through hole vias in the main backplane and interconnection detail between the power connector, a rear power receptacle, and a rear power plug on the power backplane.
Figure 4:
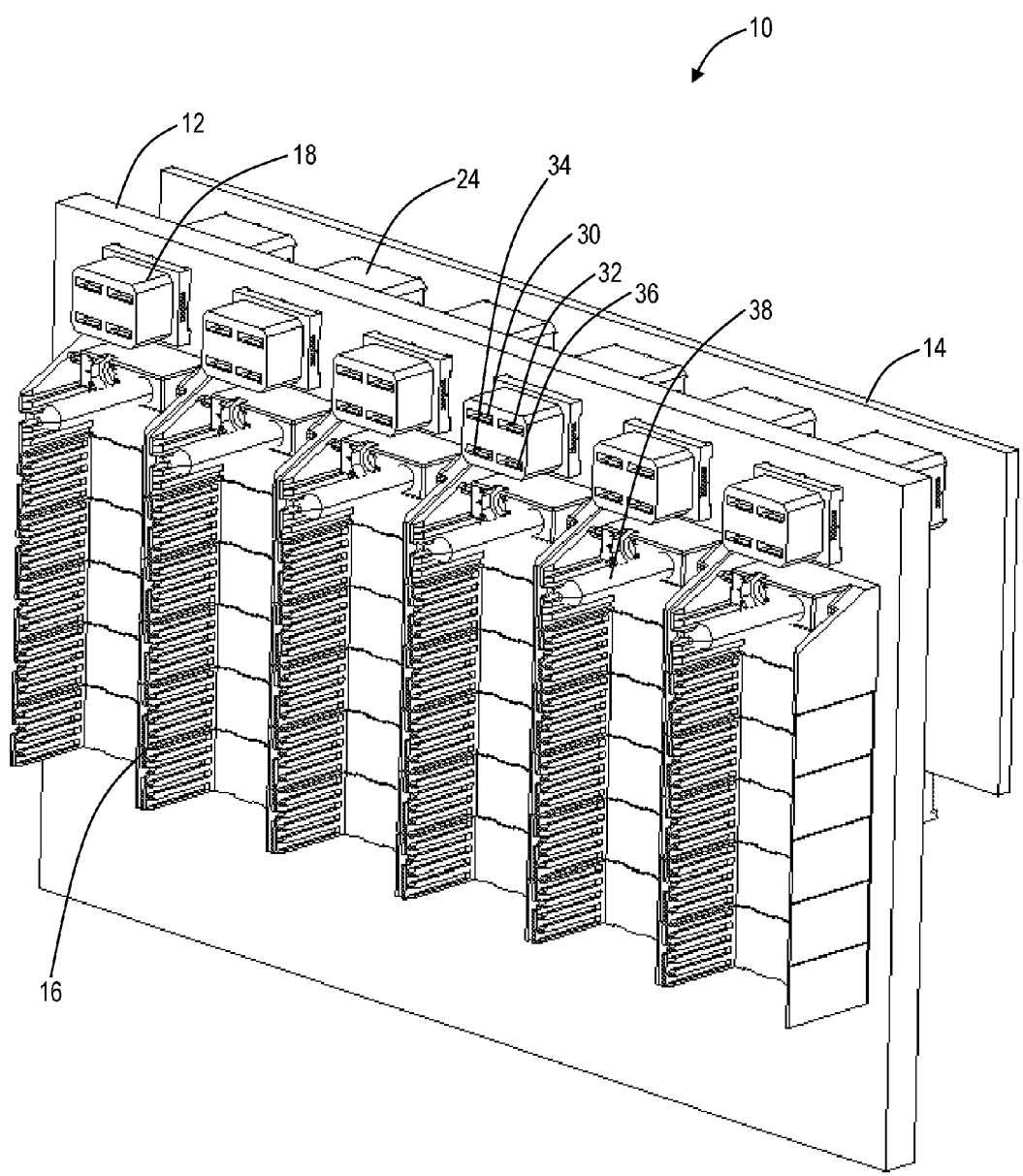
FIG. 4 is a perspective diagram of the power backplane connected to the main backplane.
Figure 5:
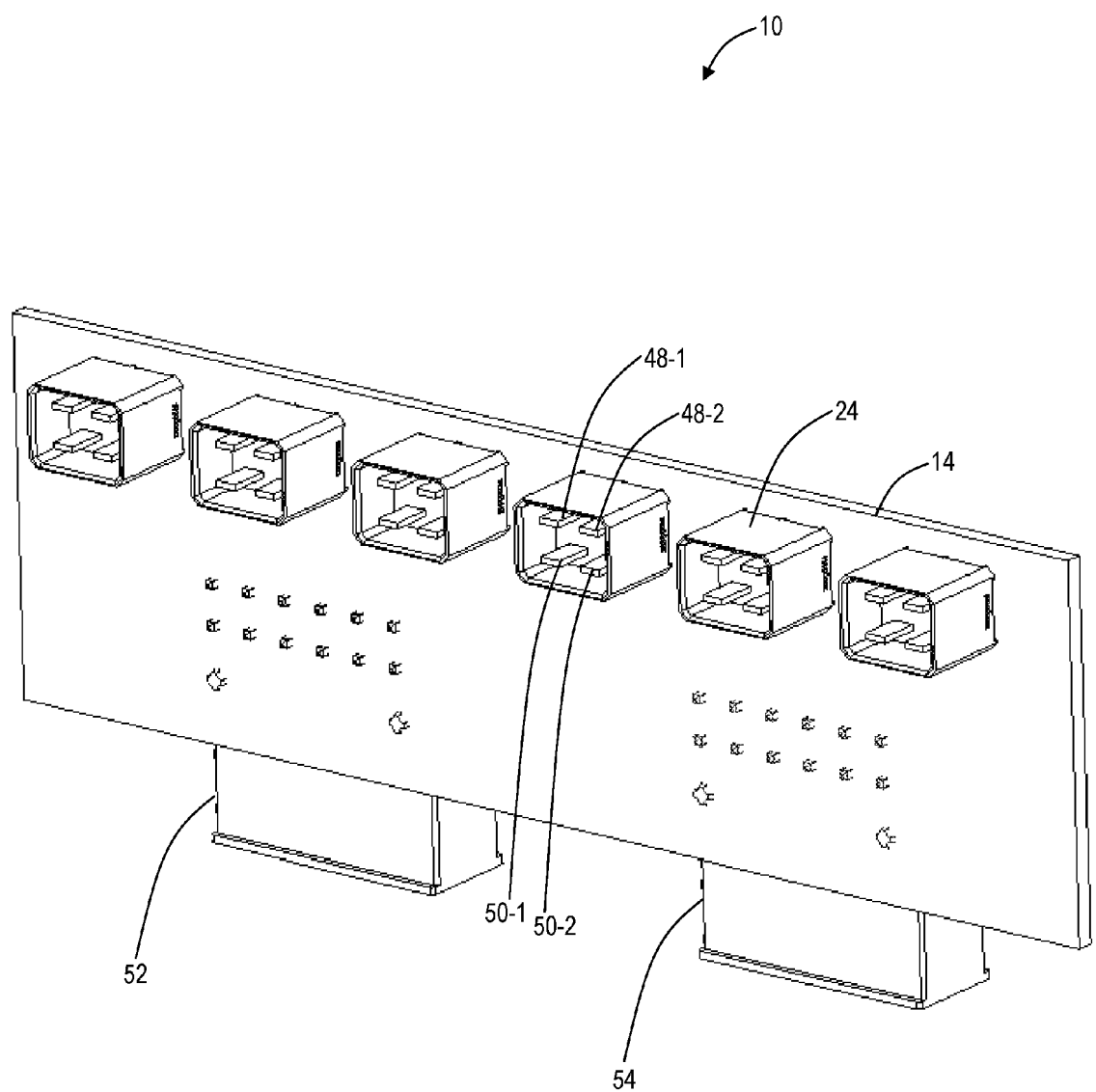
FIG. 5 is a perspective diagram of the power backplane disconnected from the main backplane (not shown in FIG. 5)
Figure 6:
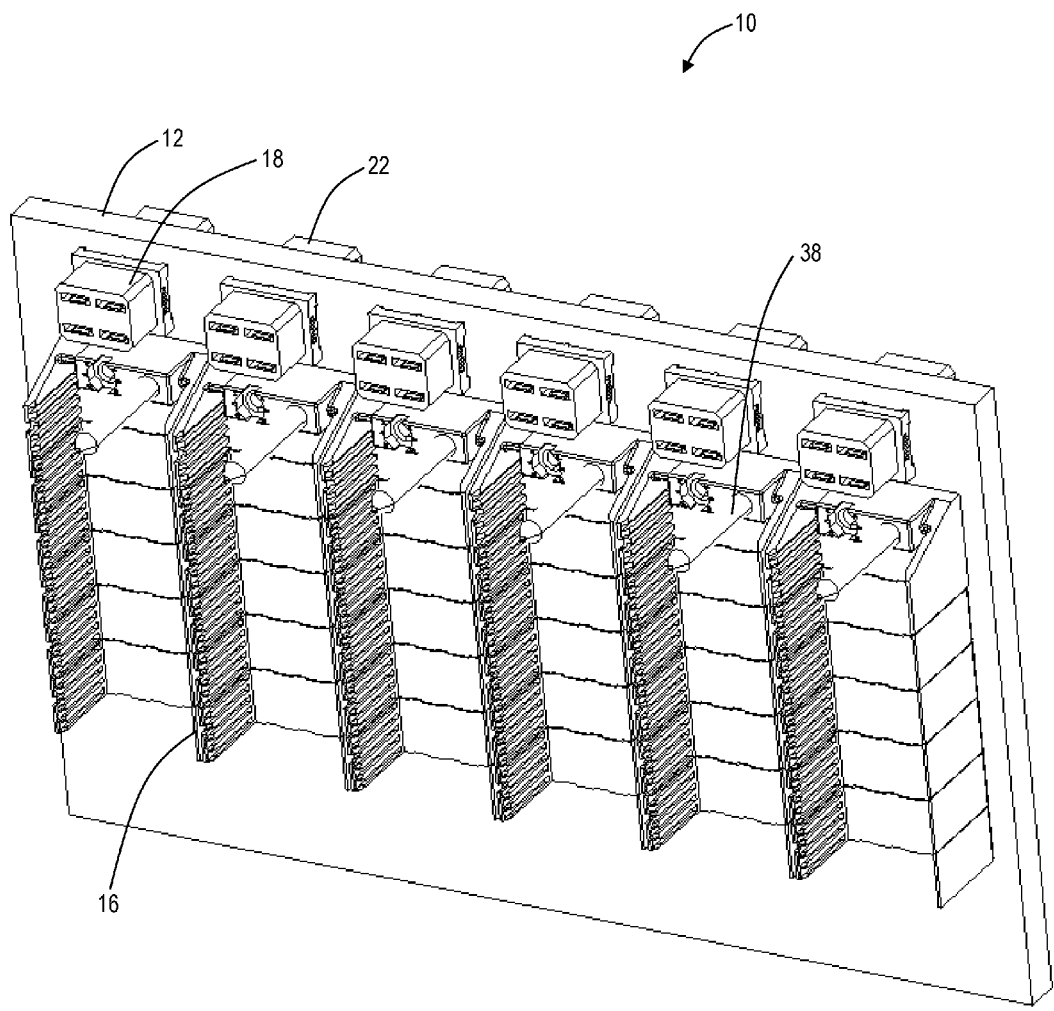
FIG. 6 is a perspective diagram of the main backplane disconnected from the power backplane (not shown in FIG. 6)
Figure 7:
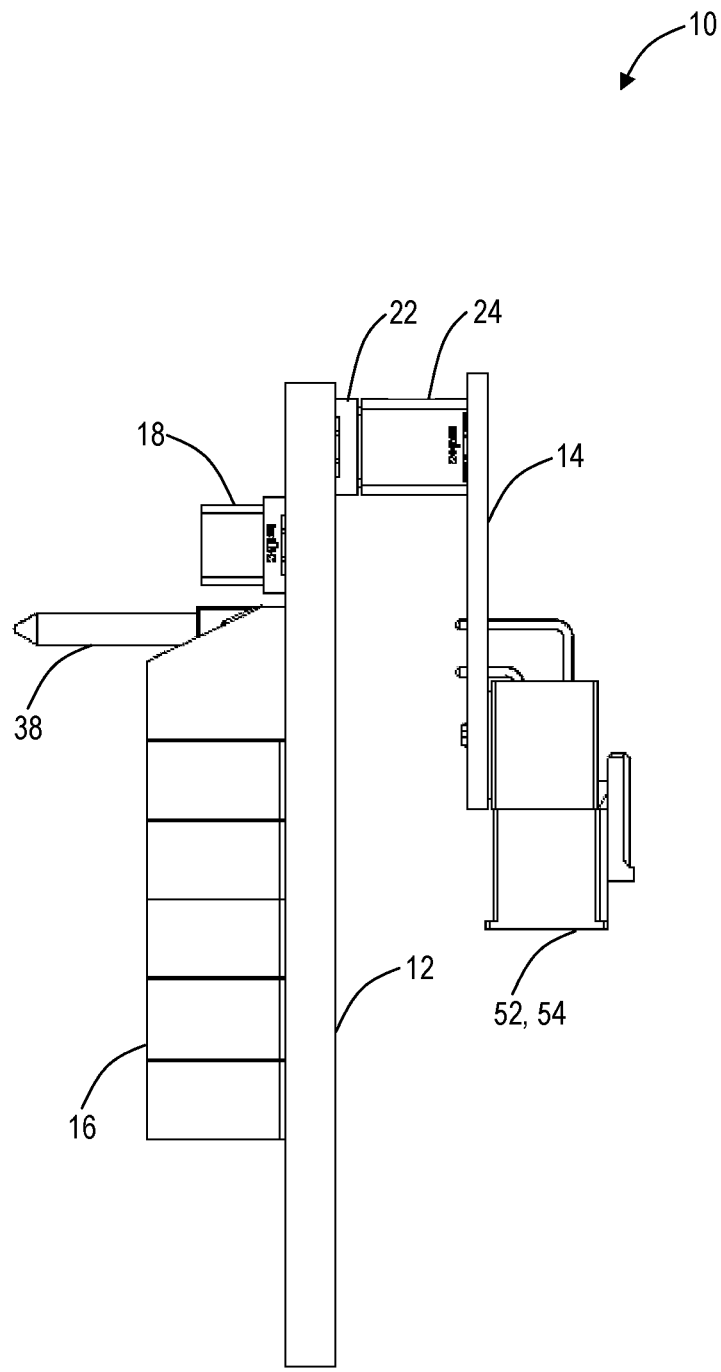
FIG. 7 is a cross-sectional diagram of another exemplary embodiment of the backplane configuration with the power connector offset from the rear power receptacle and the rear power plug.

Referring to FIGS. 1-7, in various exemplary embodiments, various diagrams illustrate a backplane configuration 10 with a main backplane 12 and a power backplane 14. FIG. 1 is a front perspective diagram of the main backplane 12 where modules (not shown) are selectively plugged into high-speed connectors 16 and a power connector 18. FIG. 2 is a cross-sectional diagram of a cross-section from FIG. 1 illustrating an interconnection between the main backplane 12 and the power backplane 14. FIG. 3 is a cross-sectional diagram of additional detail from FIG. 2 illustrating through hole vias 20 in the main backplane 12 and interconnection detail between the power connector 18, a rear power receptacle 22, and a rear power plug 24 on the power backplane 14. FIG. 4 is a perspective diagram of the power backplane 14 connected to the main backplane 12. FIG. 5 is a perspective diagram of the power backplane 14 disconnected from the main backplane 12 (not shown in FIG. 5). FIG. 6 is a perspective diagram of the main backplane 12 disconnected from the power backplane 14 (not shown in FIG. 6). FIG. 7 is a cross-sectional diagram of another exemplary embodiment of the backplane configuration 10 with the power connector 18 offset from the rear power receptacle 22 and the rear power plug 24.

The backplane configuration 10 utilizes the power backplane 14 which can be a daughter board to distribute power and deliver power into the main backplane 12 to avoid the need for additional layers for power distribution on the main backplane 12. In FIGS. 2-6, the power backplane 14 provides the power at the location required, i.e., the power connector 18, the rear power receptacle, and the rear power plug 24 are in a same horizontal plane. Specifically, the main backplane 12 only has control and data connectivity and power connectivity is performed through the power backplane 14. The main backplane 12 has a plurality of traces for data and control connectivity. Again, the backplane configuration 10 can advantageous be used in high-speed data applications, i.e., tens to hundreds of Gb/s connectivity between modules and by avoiding power distribution on the main backplane 12, the space and cost of the main backplane are reduced, and the electrical performance is increased.

In FIG. 1, modules (not shown in FIG. 1, but illustrated in FIG. 8) plug into the main backplane 12. The modules can include a PCB with electrical circuitry, optical components, etc. collectively configured to perform some function, e.g., packet switching, Time Division Multiplexing (TDM) switching, computing, etc. The PCB includes mate high-speed connectors configured to connect to the high-speed connectors 16 and a mate power connector configured to connect with the power connector 18. From the module's perspective, the power connector 18 provides power via the power connector 18 and data/control connectivity via the high-speed connectors 16. The power connector 18 can include four connections 30, 32, 34, 36 which can provide two feeds, A and B, and supply and return currents for each.

The connections 30, 32, 34, 36 can be mechanical connections such as clips or the like which create an electrical engagement. Also, the main backplane 12 can include a guide pin 38 which is used to engage mechanically the modules to ensure proper engagement with the connectors 16, 18.

In an exemplary embodiment illustrated in FIGS. 2-6, the power backplane 14 connects to modules using the through hole vias 20. FIGS. 2 and 3 illustrate the interconnection between the main backplane 12 and the power backplane 14. Specifically, the power connector 18 has connections 40 which connect to the connections 30, 32, 34, 36 and which extend through the through hole vias 20. The connections 40 are coupled to connections 42 on the rear power receptacle 22. The rear power receptacle 22 can include connections 44, 46 which connect to connections 48, 50 on the rear power plug 24. The rear power receptacle 22 connects to the power backplane 14 for routing of the A and B power feeds, both supply and return current. Thus, the supply and return current for the A and B power feeds flows between the power backplane 14, the rear power plug 24 via the connections 48, 50, the rear power receptacle 22 via the connections 44, 46, through the vias 20 via the connections 42, 40, and to the connections 30, 32, 34, 36 via the power connector 18.

FIGS. 4-6 are various perspective diagrams of the backplane configuration 10. Note, the power backplane 14 can have substantially less height and overall surface area as the main backplane 12. Note, the power connector 18 and the rear power receptacle 22 can each be a female-type plug or connector, and the rear power plug 24 and associated plug on the modules (not shown) can be a male-type plug or connector. In FIG. 5, the rear power plug 24 is shown with connections 48-1, 48-2, 50-1, 50-2, and power feed connections 52, 54. Again, the connections 48-1, 48-2, 50-1, 50-2 support the supply and return current for the A and B feeds. The power feed connections 52, 54 are configured to connect to a power supply (not shown) such as a −48 VDC power supply which may be located in a frame or rack.

Again, the exemplary embodiment of FIGS. 2-6 has the power connections substantially horizontal. In another exemplary embodiment illustrated in FIG. 7, alternate connectors could be used in close proximity to the backplane power connector. This requires routing of the power on the main backplane 12, but additional backplane layers can still be avoided, if the alternate connectors are closely coupled, and the power tracks can use layers already required by control and data tracks.

Advantageously, the backplane configuration 10 can i) use the power backplane 14 for power distribution, to eliminate power layers on the main backplane 12; ii) use back-to-back power connectors 18, 22, 24 to eliminate the space required for the input power connection; iii) use the power backplane 14 to allow the use of mixed technology (solder and compliant) on an inexpensive distribution Printed Circuit Board (PCB); etc. The main backplane 12, by keeping power distribution on the power backplane 14, limits the layer count, thickness, and size, and, by using back to back connectors 18, 22, 24, no additional power layers are required, and no additional space is required for input connection. Alternatively, the connectors 18, 22, 24 could be adjacent to one another, to avoid the need for additional layers, and minimal additional board area being required. When the power connectors 18, 22, 24 are adjacent to each other, layers used for signal routing in other areas of the backplane can be used for power in the area of the power connectors.

Figure 8:
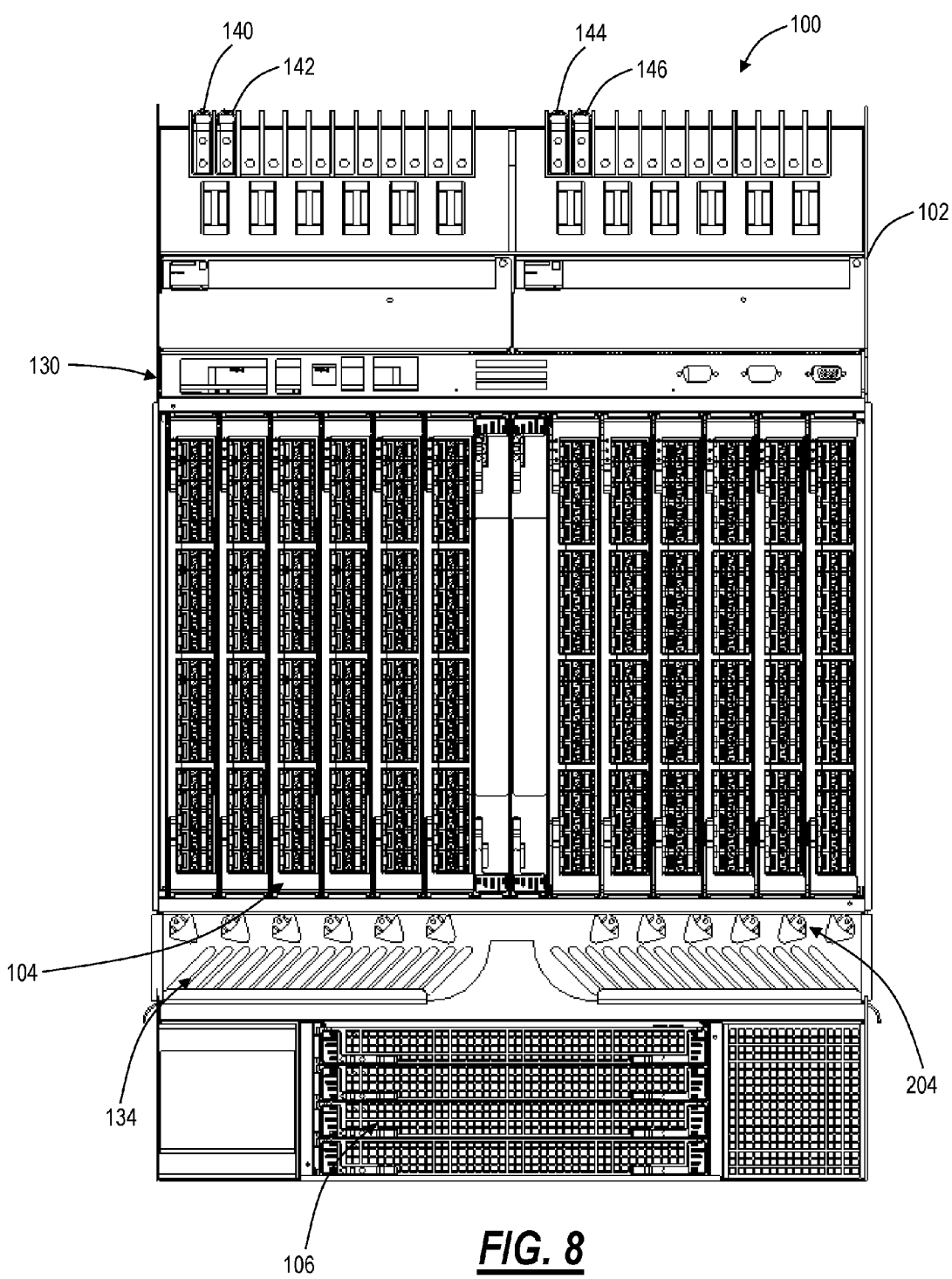
FIG. 8 is a front perspective diagram of a high-speed network element utilizing the backplane configuration of FIGS. 1-7.

Referring to FIG. 8, in an exemplary embodiment, a front perspective diagram illustrates a high-speed network element 100 utilizing the backplane configuration 10. The high-speed network element 100 can be a shelf, chassis, a system, etc. forming a network element, a node, etc. in a network, element in a data center, etc. FIG. 8 is a front perspective diagram of the high-speed network element 100. The high-speed network element 100 can be mounted in a rack or frame, such as a 19" or 23" rack.

In an exemplary embodiment, the high-speed network element 100 can be a network element that may consolidate the functionality of a multi-service provisioning platform (MSPP), digital cross-connect (DCS), Ethernet and/or Optical Transport Network (OTN) switch, Dense Wave Division Multiplexing (DWDM) platform, etc. into a single, high-capacity intelligent switching system providing Layer 0, 1, 2, and/or 3 consolidation. In another exemplary embodiment, the high-speed network element 100 can be any of an OTN add/drop multiplexer (ADM), a SONET/SDH/OTN ADM, a multi-service provisioning platform (MSPP), a digital cross-connect (DCS), an optical cross-connect, an optical switch, a router, a switch, a wavelength division multiplexing (WDM) terminal, an access/aggregation device, etc. That is, the high-speed network element 100 can be any digital and/or optical system with ingress and egress signals and switching of channels, timeslots, tributary units, packets, etc. utilizing OTN, SONET, SDH, Ethernet, IP, etc. In yet another exemplary embodiment, the high-speed network element 100 can be a high-rate Ethernet switch. In a further exemplary embodiment, the high-speed network element 100 can be a data center switch, a rack server, a storage device, or the like. Those of ordinary skill in the art will appreciate the high-speed network element 100 can be any electrical and/or optical system capable of high-data-rate operation.

The high-speed network element 100 includes a chassis 102 which can refer to any shelf, rack, cabinet, case, frame, or other apparatus used to arrange and/or support a plurality of electronic/optical modules such as interface modules 104 and switch fabric modules 106. The housing 102 may be metal, plastic, or combination, or other suitable material and similar in construction to other housings, cabinets and/or racks used to hold electronic/optical components in place. Further, the housing 102 may be rack mounted in an ETSI, ANSI, etc. compliant rack or frame.

The interface modules 104 can include one or more optical transceivers, such as, for example, 1 Gb/s (GbE PHY), 2.5 Gb/s (OC-48/STM-1, OTU1, ODU1), 10 Gb/s (OC-192/STM-64, OTU2, ODU2, 10 GbE PHY), 40 Gb/s (OC-768/STM-256, OTU3, ODU3, 40 GbE PHY), 100 Gb/s (OTU4, ODU4, 100 GbE PHY), etc. The interface cards 104 can be referred to as line cards, line blades, I/O modules, etc. and can include a plurality of optical modules in the front. For example, the optical modules can be pluggable modules such as, without limitation, XFP, SFP, XENPAK, X2, CFP, CFP2, CFP4, etc. Further, the interface cards 104 can include a plurality of optical connections per module and each module may include a flexible rate support for any type of connection, such as, for example, 155 Mb/s, 622 Mb/s, 1 Gb/s, 2.5 Gb/s, 10 Gb/s, 40 Gb/s, and 100 Gb/s and beyond, and any rate in between. The interface cards 104 can include wavelength division multiplexing interfaces, short reach interfaces, and the like, and can connect to other interface cards 104 on remote network elements, end clients, edge routers, and the like.

From a logical perspective, the interface cards 104 provide ingress and egress ports to the high-speed network element 100, and each interface card 104 can include one or more physical ports. The switch fabric cards 106 are configured to switch channels, timeslots, tributary units, packets, cells, etc. between the interface cards 104. For example, the interface cards 104 can provide wavelength granularity (Layer 0 switching), SONET/SDH granularity such as Synchronous Transport Signal-1 (STS-1) and variants/concatenations thereof (STS-n/STS-nc), Synchronous Transport Module level 1 (STM-1) and variants/concatenations thereof, Virtual Container 3 (VC3), etc.; OTN granularity such as Optical Channel Data Unit-1 (ODU 1), Optical Channel Data Unit-2 (ODU2), Optical Channel Data Unit-3 (ODU3), Optical Channel Data Unit-4 (ODU4), Optical Channel Data Unit-flex (ODUflex), Optical channel Payload Virtual Containers (OPVCs), ODTUGs, etc.; Ethernet packet granularity; the like. Specifically, the switch fabric cards 106 can include both Time Division Multiplexed (TDM) (i.e., circuit switching) and packet switching engines. The interface cards 104 and/or the switch fabric cards 106 can include redundancy as well, such as 1:1, 1:N, etc. In an exemplary embodiment, the switch fabric cards 116 provide OTN, SONET, or SDH switching.

In an exemplary embodiment, the high-speed network element 100 supports 10 slots. In another exemplary embodiment, the high-speed network element 100 supports 20 slots (double height configuration from FIG. 8). Exemplary high-speed network elements 100 can include Ciena Corporation's 8700 Packetwave platform, Ciena's 5400 or 6500 multi-Tb/s Packet-Optical Transport System (POTS), and the like. Note, the high-speed network element 100 can support high data rates as well as high power consumption such as 10,000 W or more. In such configurations, each slot may require 20A or more. The high-speed network element 100 can utilize the backplane configuration 10.

Those of ordinary skill in the art will recognize the high-speed network element 100 can include other components which are omitted for illustration purposes, and that the systems and methods described herein are contemplated for use with a plurality of different network elements with the high-speed network element 100 presented as an exemplary type of network element. For the high-speed network element 100, other architectures providing ingress, egress, and switching are also contemplated for the systems and methods described herein. In general, the systems and methods described herein contemplate use with any network element, node, or the like supporting high-data-rate applications. Furthermore, the high-speed network element 100 is merely presented as one exemplary implementation for the systems and methods described herein.

The high-speed network element 100 includes common equipment 130, a fiber manager 134, and power connections 140, 142, 144, 146. The common equipment 130 is utilized for operations, administration, maintenance, and provisioning (OAM&P) access; user interface ports; and the like. The common equipment 130 can connect to a management system through a data communication network (DCN). For example, the common equipment 130 can include an Ethernet port for communication to the DCN. The power connections 140, 142, 144, 146 provide connectivity for two power feeds A and B for supply and return current to a power source (not shown). In an exemplary embodiment, the power source is a −48 VDC source. The 140, 142, 144, 146 are ultimately connected to the power backplane 14, such as through the power feed connections 52, 54.

Figure 9:
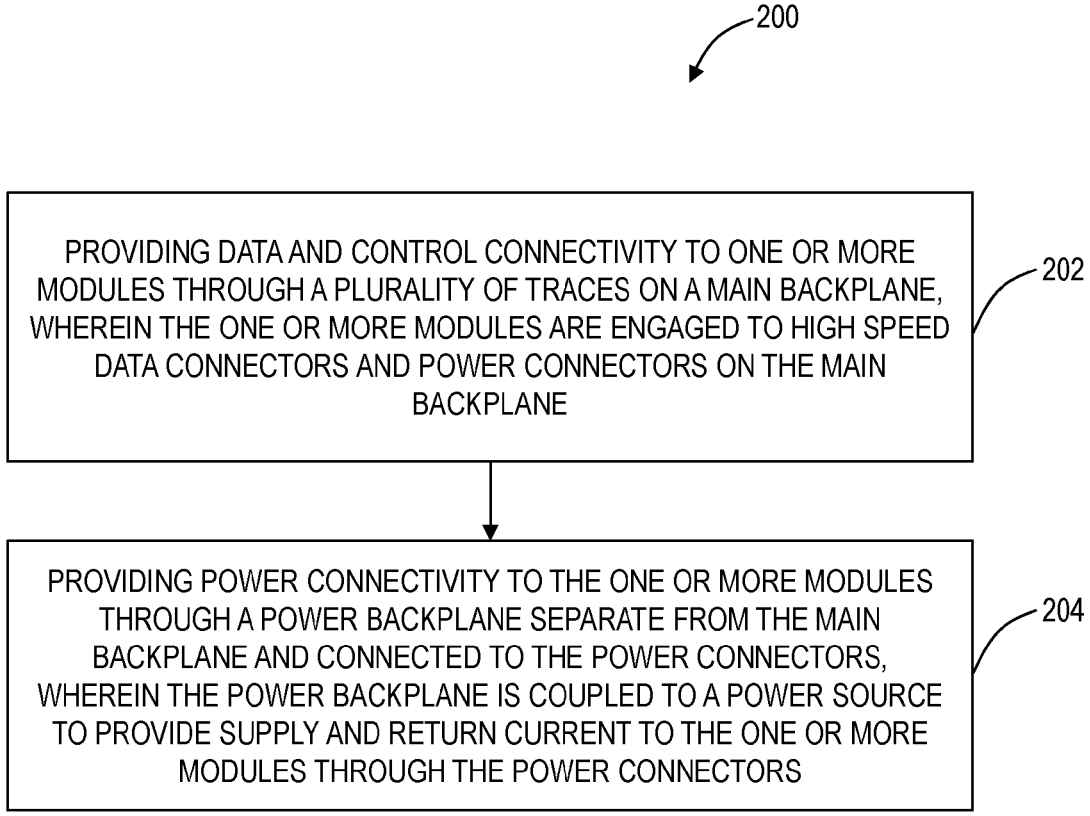
FIG. 9 is a flowchart of an operating method for a high-speed network element utilizing the backplane configuration of FIGS. 1-7.

Referring to FIG. 9, in an exemplary embodiment, a flowchart illustrates an operating method 200 of a high-speed network element 100. The operating method 200 includes providing data and control connectivity to one or more modules through a plurality of traces on the main backplane, wherein the one or more modules are engaged to high-speed data connectors and power connectors on the main backplane (step 202); and providing power connectivity to the one or more modules through a power backplane separate from the main backplane and connected to the power connectors, wherein the power backplane is coupled to a power source to provide supply and return current to the one or more modules through the power connectors (step 204). The main backplane can have no power layers, and no power connectivity routed thereon. The power backplane can be connected to the power connectors on the main backplane by through hole vias. A rear power plug can be located on an opposite side of the main backplane as the power connectors, wherein the rear power plug is connected to the power connectors; wherein a power plug can be located on the power backplane connected to the rear power plug; and wherein the power connectors, the rear power plug, and the power plug are in a back-to-back configuration where each is substantially in a same horizontal plane. A rear power plug can be located on an opposite side of the main backplane as the power connectors, wherein the rear power plug is connected to the power connectors; wherein a power plug can be located on the power backplane connected to the rear power plug; and wherein the power connectors are in close proximity to the rear power plug such that the main backplane has minimal routing of power from the rear power plug to the power connectors. The power connectors can provide supply and return currents for two power feeds from the power backplane.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A backplane system for a high-speed network element, the backplane system comprising:

a main backplane including a plurality of traces for data and control connectivity, high-speed data connectors, and power connectors, wherein the high-speed data connectors and the power connectors are configured to engage one or more modules at a front surface of the main backplane; and a power backplane for power connectivity disposed adjacent to a back surface of the main backplane and connected to the power connectors of the main backplane via rear power connectors which are offset from to the power connectors, wherein the power backplane is coupled to a power source to provide supply and return current to the one or more modules through the power connectors of the main backplane and through power tracks between the rear power connectors and the power connectors, wherein the power connectors and the rear power connectors provide supply and return currents for two power feeds from the power backplane to the main backplane for the one or more modules, and wherein the offset distance is close enough that copper distribution layers are avoided on the main backplane for the power connectivity, and wherein the power connectivity over the offset distance between the power connectors and the rear power connectors is over control and data tracks on the main backplane.

2. The backplane system of claim 1, wherein the main backplane has no power layers.

3. The backplane system of claim 1, wherein the power backplane is connected to the power connectors on the main backplane by through hole vias.

4. The backplane system of claim 1, further comprising:
a rear power receptacle located on an opposite side of the main backplane as the power connectors, wherein the rear power receptacle is connected to the power connectors; and
a power plug on the power backplane connected to the rear power receptacle.

5. The backplane system of claim 4, wherein the power connectors are disposed adjacent to the rear power receptacle such that the main backplane has minimal routing of power from the rear power receptacle to the power connectors.

6. A high-speed network element, comprising:
a chassis supporting one or more modules;
a main backplane in the chassis, wherein the main backplane includes a plurality of traces for data and control connectivity, high-speed data connectors, and power connectors, wherein the high-speed data connectors and the power connectors are configured to engage the one or more modules at a front surface of the main backplane; and
a power backplane for power connectivity disposed adjacent to a back surface of the main backplane and connected to the power connectors of the main backplane via rear power connectors which are offset from the power connectors, wherein the power backplane is coupled to a power source to provide supply and return current to the one or more modules indirectly through the power connectors of the main backplane and through power tracks between the rear power connectors and the power connectors,
wherein the power connectors and the rear power connectors provide supply and return currents for two power feeds from the power backplane to the main backplane for the one or more modules, and
wherein the offset distance is close enough that copper distribution layers are avoided on the main backplane for the power connectivity, and wherein the power connectivity over the offset distance between the power connectors and the rear power connectors is over control and data tracks on the main backplane.

7. The high-speed network element of claim 6, wherein the main backplane has no power layers.

8. The high-speed network element of claim 6, wherein the power backplane is connected to the power connectors on the main backplane by through hole vias.

9. The high-speed network element of claim 6, further comprising:

a rear power receptacle located on an opposite side of the main backplane as the power connectors, wherein the rear power receptacle is connected to the power connectors; and
a power plug on the power backplane connected to the rear power receptacle.

10. The high-speed network element of claim 9, wherein the power connectors are disposed adjacent to the rear power receptacle such that the main backplane has minimal routing of power from the rear power receptacle to the power connectors.

11. The high-speed network element of claim 6, wherein the one or more modules support data connectivity through the high-speed network element of at least one Tb/s.

12. An operating method of a high-speed network element, the method comprising:
providing data and control connectivity to one or more modules through a plurality of traces on a main backplane, wherein the one or more modules are engaged to high-speed data connectors and power connectors on a front surface of the main backplane; and
providing power connectivity to the one or more modules through a power backplane disposed adjacent to a back surface of the main backplane and connected to the power connectors of the main backplane via rear power connectors which are offset from the power connectors, wherein the power backplane is coupled to a power source to provide supply and return current to the one or more modules indirectly through the power connectors of the main backplane and through power tracks between the rear power connectors and the power connectors,
wherein the power connectors and the rear power connectors provide supply and return currents for two power feeds from the power backplane to the main backplane for the one or more modules, and
wherein the offset distance is close enough that copper distribution layers are avoided on the main backplane for the power connectivity, and wherein the power connectivity over the offset distance between the power connectors and the rear power connectors is over control and data tracks on the main backplane.

13. The operating method of claim 12, wherein the main backplane has no power layers.

14. The operating method of claim 12, wherein the power backplane is connected to the power connectors on the main backplane by through hole vias.

15. The operating method of claim 12, wherein a rear power receptacle is located on an opposite side of the main backplane as the power connectors, wherein the rear power receptacle is connected to the power connectors;
wherein a power plug is located on the power backplane connected to the rear power receptacle; and
wherein the power connectors are disposed adjacent to the rear power receptacle such that the main backplane has minimal routing of power from the rear power receptacle to the power connectors.

* * * * *